(12) United States Patent
Nishimura et al.

(10) Patent No.: US 7,781,803 B2
(45) Date of Patent: Aug. 24, 2010

(54) SEMICONDUCTOR MEMORY DEVICE

(75) Inventors: Jun Nishimura, Kanagawa-ken (JP); Yoshiaki Asao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 12/339,814

(22) Filed: Dec. 19, 2008

(65) Prior Publication Data
US 2009/0174007 A1  Jul. 9, 2009

(30) Foreign Application Priority Data
Dec. 20, 2007  (JP) ............................. 2007-329243

(51) Int. Cl.
*H01L 27/11* (2006.01)

(52) U.S. Cl. .................. 257/206; 257/390; 257/654; 257/E21.619

(58) Field of Classification Search ................ 257/206, 257/390, 404, 653, 654, E21.619
See application file for complete search history.

(56) References Cited

U.S. PATENT DOCUMENTS

| 5,021,847 | A | * | 6/1991 | Eitan et al. ............. 365/185.16 |
| 6,476,439 | B2 | * | 11/2002 | Chen ........................ 257/315 |
| 6,621,725 | B2 | | 9/2003 | Ohsawa |
| 7,499,331 | B2 | * | 3/2009 | Ohsawa ................... 365/185.2 |
| 2002/0121657 | A1 | * | 9/2002 | Chen ......................... 257/296 |

FOREIGN PATENT DOCUMENTS

| JP | 2003-68877 | 3/2003 |
| JP | 2003-188388 | 7/2003 |
| JP | 2009-16760 | 1/2009 |

* cited by examiner

*Primary Examiner*—Jarrett J Stark
(74) *Attorney, Agent, or Firm*—Oblon, Spivak, McClelland, Maier & Neustadt, L.L.P.

(57) ABSTRACT

A semiconductor memory device comprising: a support substrate; an insulating film formed on the support substrate; a semiconductor film formed on the insulating film; a gate insulating film formed on the semiconductor film; a gate electrode film formed on the gate insulating film; and a source region and a drain region formed in the semiconductor film so as to sandwich the gate insulating film in a gate length direction, the source and drain regions contacting the insulating film at the bottom surface, and the semiconductor memory device storing data corresponding to the amount of charges accumulated in the semiconductor film surrounded by the insulating film, the gate insulating film, and the source and drain regions and electrically floated, wherein a border length between the source region and the gate insulating film contiguous to each other is different from a border length between the drain region and the gate insulating film to each other.

16 Claims, 14 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2007-329243, filed Dec. 20, 2007, the entire contents of which are incorporated herein by reference.

BACKGROUND OF THE INVENTION

1. Field of the Invention

The present invention relates to a semiconductor memory device.

2. Description of the Related Art

A single transistor DRAM (Dynamic Random Access Memory) using an FBC (Floating Body Cell) has so far been known as a node for storing data. In such single transistor DRAM, the FBC is formed on an SOI (Silicon On Insulator) wafer having a thin semiconductor layer formed on a support substrate with an insulating layer called a BOX (Buried Oxidation) layer formed therebetween.

The single transistor DRAM, when the transistor is of an N-channel type, stores data by utilizing the variation of the threshold value of the transistor depending on the number of holes confined and accumulated in the body of the transistor surrounded by a source region and a drain region and electrically floated.

Writing data is performed by selecting the gate voltage to operate the transistor in such a way that hole-electron pairs are formed in larger number than the holes removed.

Erasing data is performed by selecting the gate voltage to operate the transistor in such a way that holes are removed at a higher rate than that at which hole-electron pairs are formed.

However, a single transistor DRAM using FBC as a node for storing data receives a smaller amount of signals as compared to a DRAM using a capacitor as a node for storing data. Therefore, the single transistor DRAM using FBC has a problem of having a low signal margin, resulting in a low writing speed.

In this regard, a single transistor DRAM having improved reading and writing speeds has been known (refer to, for example, the specification of U.S. Pat. No. 6,861,689).

The single transistor DRAM disclosed in the specification of U.S. Pat. No. 6,861,689 includes, between the drain region and the body, a region, which aids in impact ionization and thus electron/hole pair formation during writing, that is the same conductivity type as the body but of a higher concentration than the body.

The single transistor DRAM includes, adjacent to the source region and to the body, a region, which aids in diode current during erase, that is the same conductivity type as the source region but of a lower concentration than the source region.

However, the single transistor DRAM disclosed in the specification of U.S. Pat. No. 6,861,689 has a problem of having a complicated structure and increasing the number of processes of forming a region having a concentration higher than that of the body and a region having a concentration lower than that of the source region.

As a result, there are problems of reducing the productivity and increasing the production cost of the semiconductor memory device.

SUMMARY OF THE INVENTION

According to an aspect of the present invention, there is provided a semiconductor memory device comprising a cell transistor, the cell transistor including: a gate electrode film formed on a semiconductor film with a gate insulating film therebetween, the semiconductor film formed on a main surface of a support substrate with an insulating film therebetween; and a drain region and a source region formed so as to sandwich the gate electrode film in a gate length direction, and the cell transistor having a larger border length between the drain region and the gate electrode film contiguous to each other than a border length between the source region and the gate electrode film contiguous to each other.

According to another aspect of the present invention, there is provided a semiconductor memory device comprising a memory cell array including cell transistors arranged in matrix, each of the cell transistors including: a gate electrode film formed on a semiconductor film with a gate insulating film therebetween, the semiconductor film formed on a main surface of a support substrate with an insulating film therebetween; and a drain region and a source region formed so as to sandwich the gate electrode film in a gate length direction, and each of the cell transistors having a smaller border length between the drain region and the gate electrode film contiguous to each other than a border length between the source region and the gate electrode film contiguous to each other, wherein in a first direction of the matrix, each adjacent two of the cell transistors are arranged so as to share one of the drain region and the source region, and in a second direction perpendicular to the first direction, cell transistors being adjacent to each other and sandwiching an element separation region are arranged in such a way that the drain region of one cell transistor and the source region of another cell transistor face each other.

According to another aspect of the present invention, there is provided a semiconductor memory device comprising: a support substrate; an insulating film formed on the support substrate; a semiconductor film formed on the insulating film; a gate insulating film formed on the semiconductor film; a gate electrode film formed on the gate insulating film; and a source region and a drain region formed in the semiconductor film so as to sandwich the gate insulating film in a gate length direction, the source and drain regions contacting the insulating film at the bottom surface, and the semiconductor memory device storing data corresponding to the amount of charges accumulated in the semiconductor film surrounded by the insulating film, the gate insulating film, and the source and drain regions and electrically floated, wherein a border length between the source region and the gate insulating film contiguous to each other is different from a border length between the drain region and the gate insulating film to each other.

BRIEF DESCRIPTION OF THE DRAWINGS

FIG. 1A is a plan view of the semiconductor memory device, FIG. 1B is a cross-sectional view taken along line A-A of FIG. 1A when viewed in an arrow direction and FIG. 1C is a cross sectional view taken along line B-B of FIG. 1A when viewed in an arrow direction.

FIG. 2B is a cross-sectional view of the semiconductor memory device.

FIG. 10A is a plan view of the semiconductor memory device, FIG. 10B is a cross sectional view taken along line C-C of FIG. 10A when viewed in an arrow direction and FIG. 10C is a cross sectional view taken along line D-D of FIG. 10A when viewed in an arrow direction.

FIG. 11A is a plan view of the semiconductor memory device, FIG. 11B is a cross-sectional view taken along line E-E of FIG. 11A when viewed in an arrow direction and FIG. 11C is a cross-sectional view taken along line F-F of FIG. 11A when viewed in an arrow direction.

DETAILED DESCRIPTION OF THE PREFERRED EMBODIMENTS

Figure 1A:
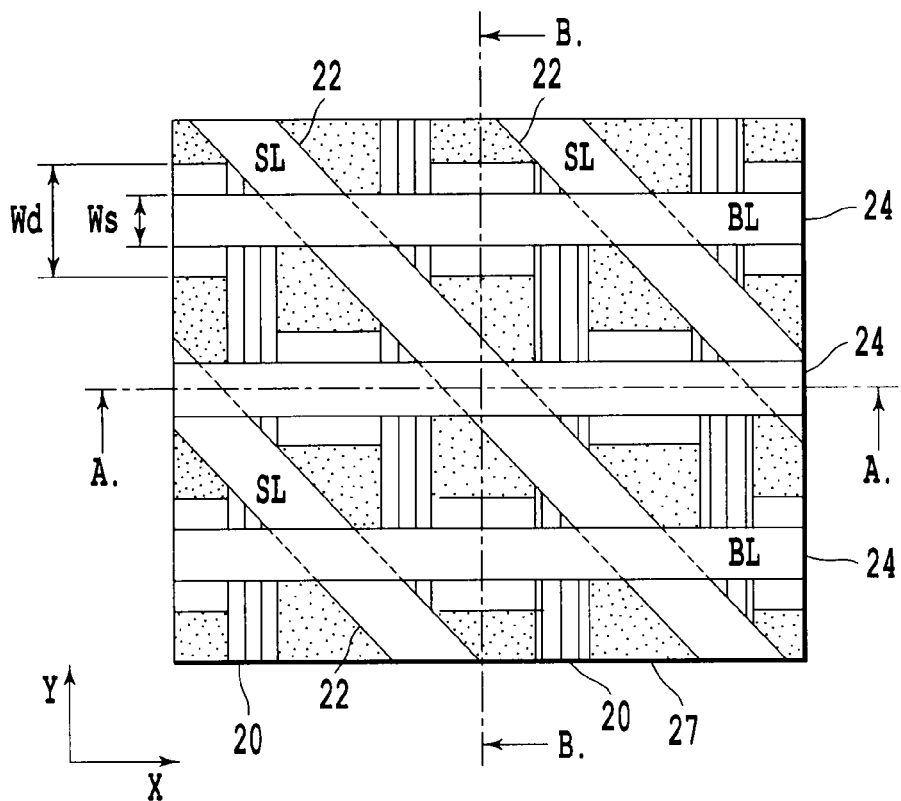
FIGS. 1A, 1B and 1C show the semiconductor memory device according to embodiment 1 of the present invention

Referring to the drawings, the embodiments of the present invention will be described below.

Embodiment 1

Figure 1B:
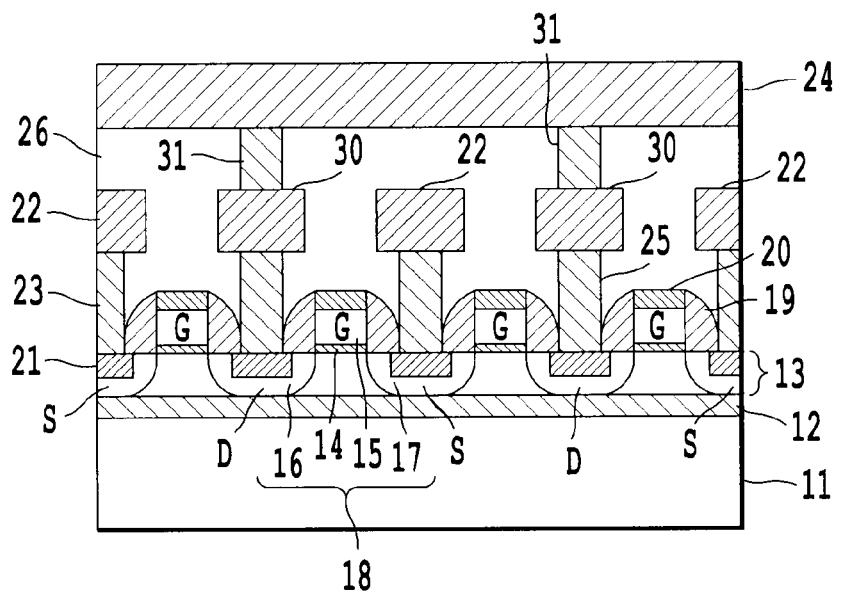
Figure 1C:
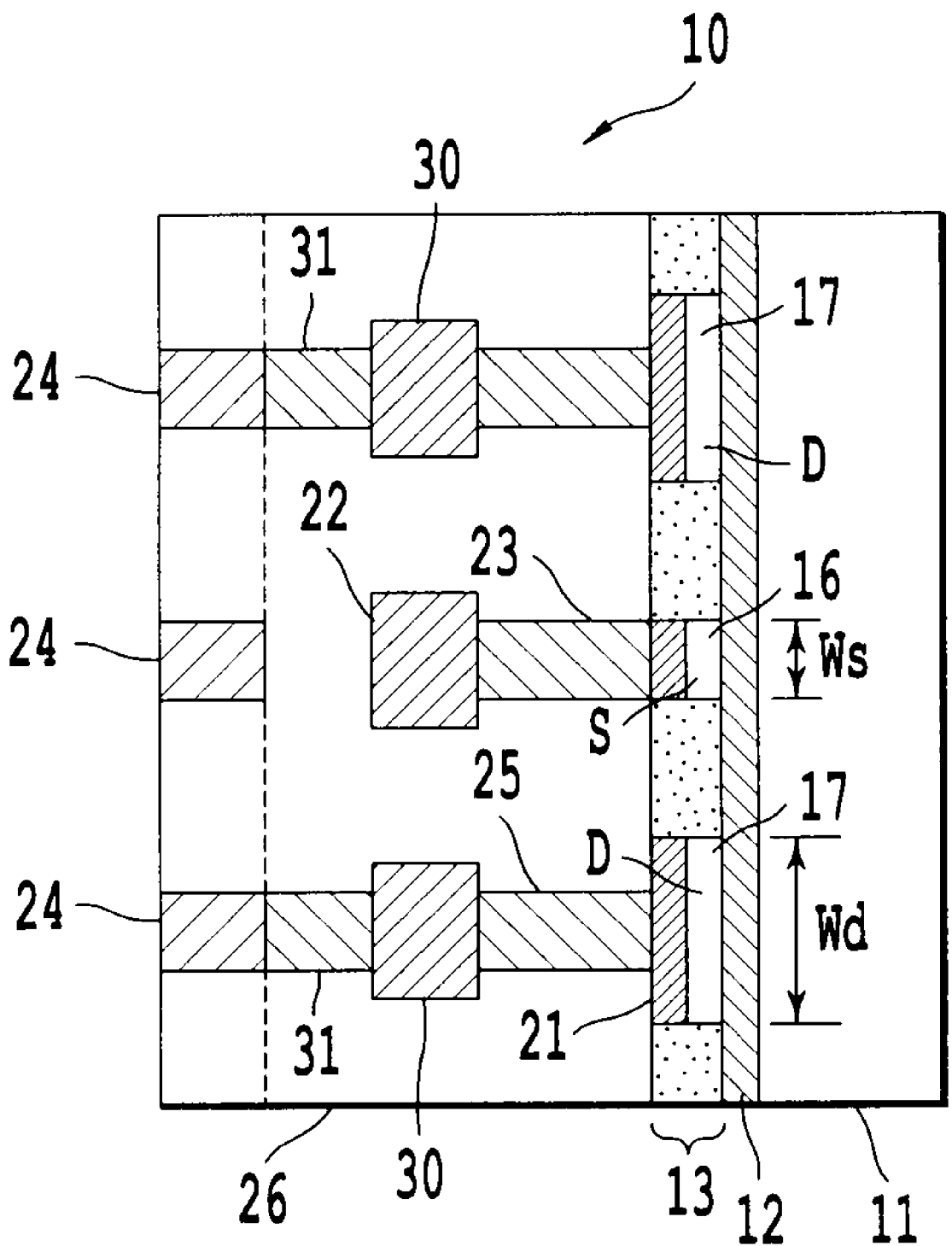
Figure 2A:
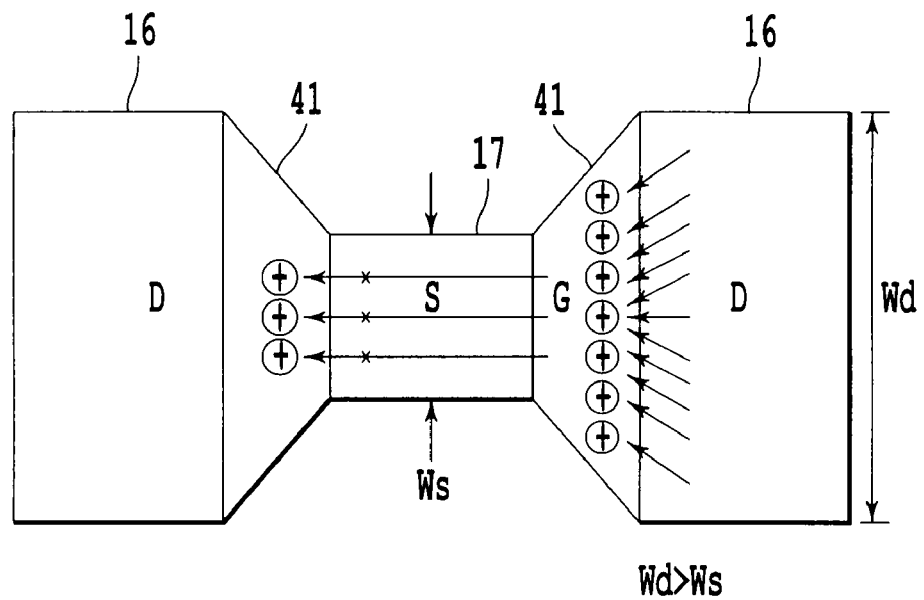
FIGS. 2A and 2B show operation of the semiconductor memory device according to embodiment 1 of the present invention and FIG. 2A is a plan view of the semiconductor memory device.
Figure 2B:
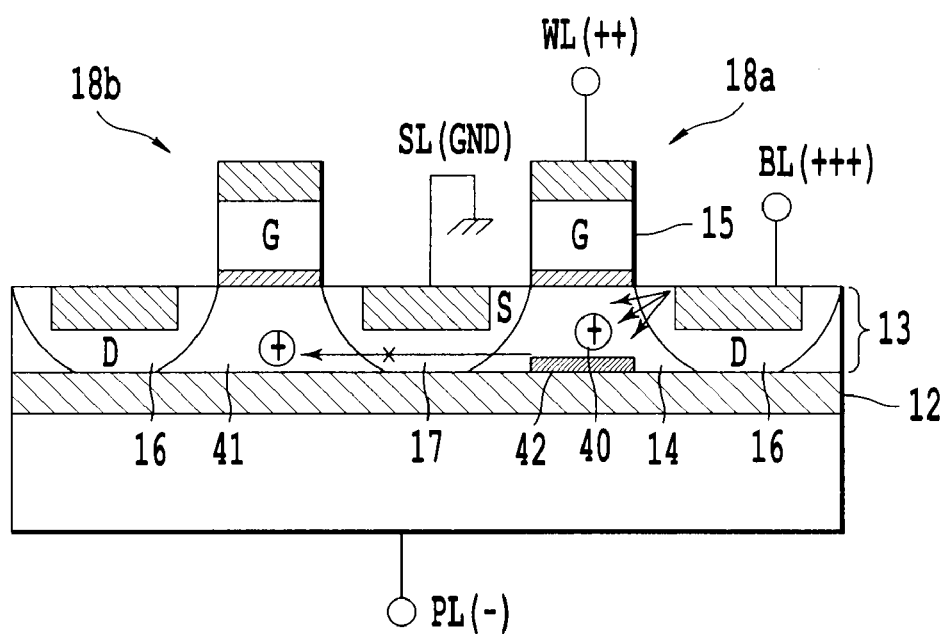

The semiconductor memory device according to the present embodiment will be described with reference to FIGS. 1 and 2. FIG. 1 shows a semiconductor memory device. FIG. 1A is a plan view of the semiconductor memory device. FIG. 1B is a cross-sectional view taken along line A-A of FIG. 1A when viewed in an arrow direction. FIG. 1C is a cross-sectional view taken along line B-B of FIG. 1A when viewed in an arrow direction. FIG. 2 shows operation of the semiconductor memory device. FIG. 2A is a plan view of the semiconductor memory device. FIG. 2B is a cross-sectional view thereof.

As shown in FIGS. 1A, 1B and 1C, a semiconductor memory device 10 according to the present embodiment includes a cell transistor 18 being a single transistor DRAM. The cell transistor 18 has a gate electrode film 15 formed on a semiconductor film 13 with a gate insulating film 14 therebetween, the semiconductor film 13 formed on the main surface of a support substrate 11 with an insulating film 12 therebetween, and a drain region 16 and source region 17 formed so as to sandwich the gate electrode film 15 in a gate length direction. In the cell transistor 18, a border length Wd between the drain region 16 and the gate electrode film 15 contiguous to each other is longer than a border length Ws between the source region 17 and the gate electrode film 15 contiguous to each other.

Furthermore, the semiconductor memory device 10 includes a sidewall film 19 formed on the side surface of the gate electrode 15, a silicide film 20 formed on the gate electrode 15, a silicide film 21 formed on the drain region 16 and the source region 17, a contact plug 23 connecting the source region 17 to a source line 22 via the silicide film 21, a contact plug 25 (via) connecting the drain region 16 to a bit line 24 via the silicide film 21, a word line (not shown) connected to the gate electrode film 15 via the silicide film 20, and an interlayer insulating film 26 covering the cell transistor 18.

The drain region 16 and the source region 17 of the cell transistor 18 are formed so as to extend from the surface of the semiconductor film 13 to the insulating film 12.

The cell transistor 18 operates as a complete depletion type MOS transistor because the thickness of the semiconductor film 13 on the insulating film 12 is small.

The cell transistors 18 are arranged in matrix to construct a memory cell array.

Each adjacent two of the cell transistors 18 are arranged so as to share one of the drain region 16 and the source region 17 in a first direction X of the matrix.

The adjacent cell transistors 18 sandwiching an element separation region (STI: Shallow Trench Isolation) 27 are arranged in such a way that the drain region 16 of one cell transistor 18 and the source region 17 of another cell transistor 18 are opposite to each other in a second direction Y perpendicular to the first direction X of the matrix.

The source regions 17, of the cell transistors 18, obliquely adjacent to each other with respect to the first direction X are commonly connected to an angled source line 22 arranged in stripes via the contact plugs 23.

The support substrate 11 is, for example, a p-type silicon substrate. The insulating film 12 is, for example, a silicon oxide film having a thickness of about 10 to 30 nm. The semiconductor film 13 is, for example, a p-type silicon film having a thickness of about 20 to 50 nm.

The support substrate 11, the insulating film 12, and semiconductor film 13 form an SIMOX (Separation by Implanted Oxygen) wafer produced by, for example, deeply implanting oxygen ions in a silicon substrate and heat-treating the silicon substrate at high temperature to form an oxide film at a certain depth from the surface of the silicon substrate and by eliminating defects caused on the surface layer.

FIGS. 2A and 2B show operation of writing data "1" in the cell transistor 18 of the semiconductor memory device 10. FIG. 2A is a schematic plan view of a cell transistor. FIG. 2B is a cross-sectional view in the gate length direction.

As shown in FIGS. 2A and 2B, data "1" is written in the cell transistor 18 in the following manner. The source line 22 is connected to a reference potential (GND), and the bit line 24 is then connected to the first positive voltage power source. Subsequently, the second positive voltage is applied to a word line. Consequently, the cell transistor 18a is turned on, and a channel current flows.

At this time, electrons are accelerated by an electric field generated by the first positive voltage, and collide against impurity atoms in the drain region 16. The electrons colliding against impurity atoms cause the impurity atoms to be ionized, resulting in an impact ionization phenomenon wherein electron-hole pairs are formed.

Generated holes 40 rush from the drain region 16 into the channel region 41 of FBC. The holes 40 rushing into the channel region 41 are attracted to the insulating film 12 because the insulating film 12 is negatively charged, and the holes 40 accumulates near the interface of the insulating film 12 in the channel region 41, resulting in the creation of hole accumulation region.

This changes the threshold of the cell transistor 18a, thus causing the cell transistor 18a to be in a state where data "1" is written therein.

The border length Wd between the drain region 16 and the gate electrode 15 contiguous to each other is then set large. Therefore, the amount of the impact-ionized holes 40 is increased. Thus, a large amount of holes 40 can rush from the drain region 16 into the channel region 41.

As a result, the amount of signals is increased, and thus a signal margin is improved. Consequently, a writing speed can be improved.

Furthermore, the border length Wd between the drain region 16 and the gate electrode 15 contiguous to each other is set small. Therefore, the resistance of the source region 17 is increased. Consequently, the holes 40 rushing from the drain region 16 into the channel region 41 can be restrained from penetrating the source region 17.

As a result, it is possible to suppress the malfunction (referred to as "1" disturb) where a data "0" state is rewritten to a data "1" state when the cell transistor 18b is in the data "0" state, due to the holes 40 penetrating the source region 17 and entering the channel region 41 of the adjacent cell transistor 18b Furthermore, the holes 40 in the holes accumulation region 42 are restrained from leaking to the source region 17 by the resistance of the source region 17. Accordingly, the data is held for a longer time period, and thus the power necessary for refresh can be reduced.

The border length Wd between the drain region 16 and the gate electrode 15 contiguous to each other and the border length Ws between the source region 17 and the gate electrode film 15a contiguous to each other only need to be within a range of length providing a desired characteristics and are not particularly limited.

For example, the ratio of the length Wd to the length Ws is appropriately about 1.5 to 2 times in consideration of the integration degree and the obtained effect.

A method of manufacturing the semiconductor memory device 10 will then be described with reference to FIGS. 3 to 9. In each figure, a symbol "A" after a figure number represents a plan view. A symbol "B" represents a cross-sectional view taken along line A-A of FIG. 3A when viewed in an arrow direction. A symbol "C" represents a cross-sectional view taken along line B-B of FIG. 3A when viewed in an arrow direction.

Figure 3A:
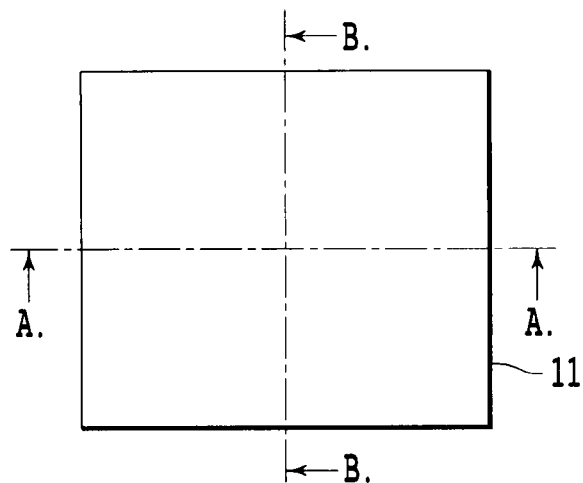
FIGS. 3A, 3B and 3C sequentially show processes of manufacturing the semiconductor memory device according to embodiment 1 of the present invention.
Figure 3B:
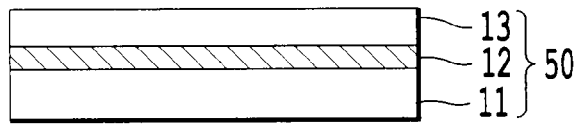
Figure 3C:
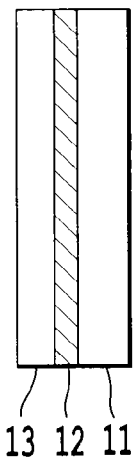

As shown in FIGS. 3A, 3B and 3C, an SOI wafer 50 including the semiconductor film 13 formed on the support substrate 11 with the insulating film 12 therebetween is firstly prepared.

Figure 4A:
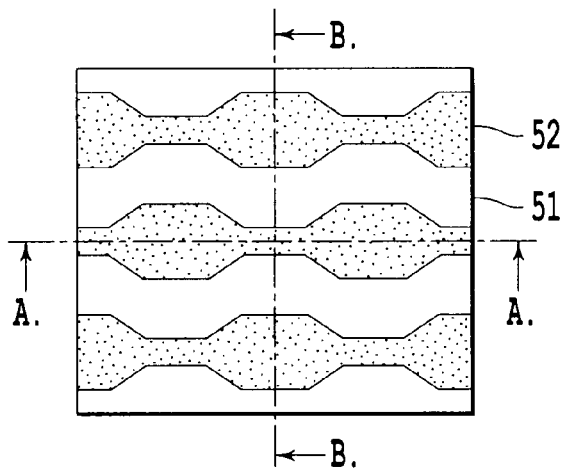
FIGS. 4A, 4B and 4C sequentially show processes of manufacturing the semiconductor memory device according to embodiment 1 of the present invention.
Figure 4B:
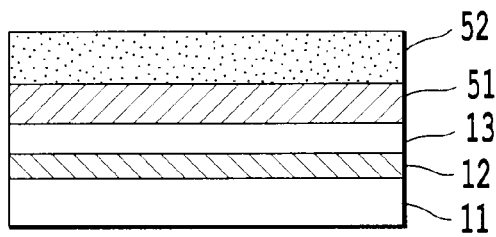
Figure 4C:
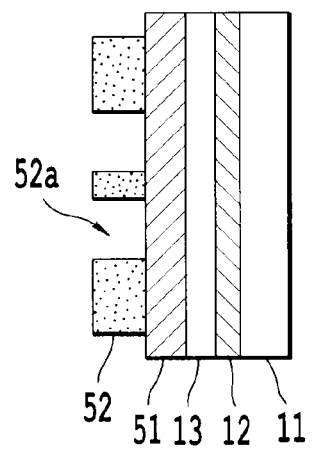

As shown in FIGS. 4A, 4B and 4C, a silicon nitride film 51 is then formed on the semiconductor film 13 by, for example, a CVD (Chemical Vapor Deposition) method.

Subsequently, a resist film 52 having an opening 52a corresponding to an insulating separation region is formed on the silicon nitride film 51 by use of a photolithography method.

Figure 5A:
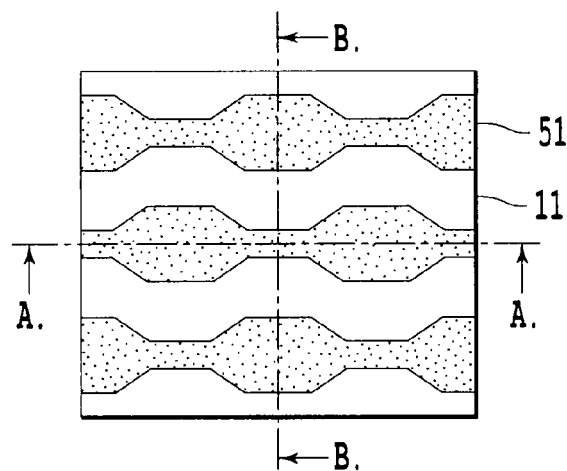
FIGS. 5A, 5B and 5C sequentially show processes of manufacturing the semiconductor memory device according to embodiment 1 of the present invention.
Figure 5B:
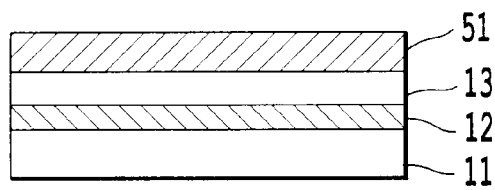
Figure 5C:
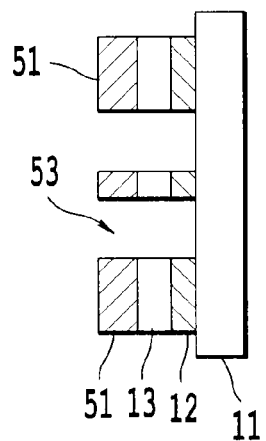

As shown in FIGS. 5A, 5B and 5C, the silicon nitride film 51 is then anisotropic etched using the resist film 52 as a mask by use of the RIE (Reactive Ion Etching) method.

Then, after the resist film 52 is removed, the semiconductor film 13 and the insulating film 12 are sequentially anisotropic etched using the silicon nitride film 51 as a mask to form a separating groove 53.

Figure 6A:
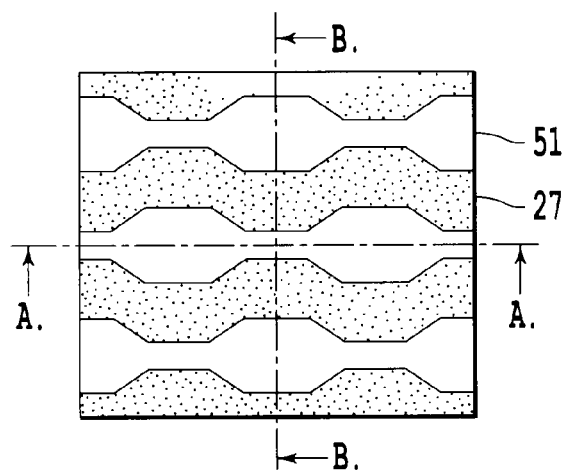
FIGS. 6A, 6B and 6C sequentially show processes of manufacturing the semiconductor memory device according to embodiment 1 of the present invention.
Figure 6B:
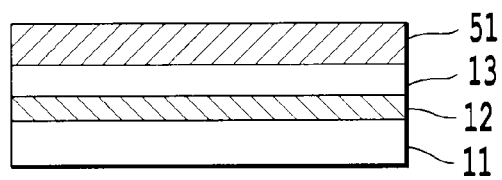
Figure 6C:
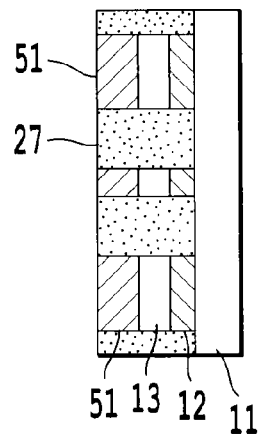

As shown in FIGS. 6A, 6B and 6C, a silicon oxide film is subsequently formed on the entire surface of the support substrate 11 by a CVD method, for example. An excessive silicon oxide film is then removed by use of the CMP (Chemical Mechanical Polishing) method. Then, a silicon oxide film is embedded in the separating groove 53. Consequently, an STI 27 is formed.

Figure 7A:
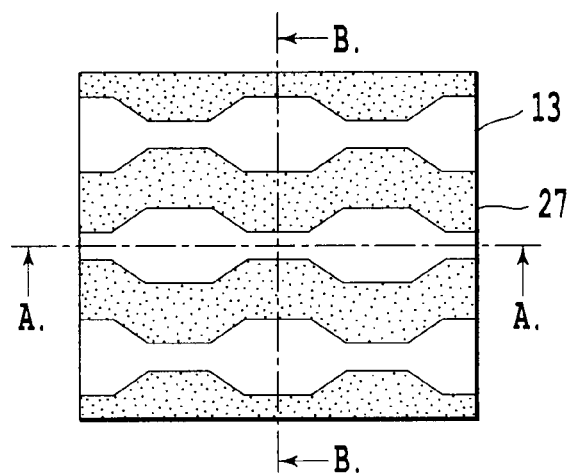
FIGS. 7A, 7B and 7C sequentially show processes of manufacturing the semiconductor memory device according to embodiment 1 of the present invention.
Figure 7B:
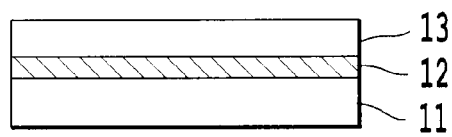
Figure 7C:
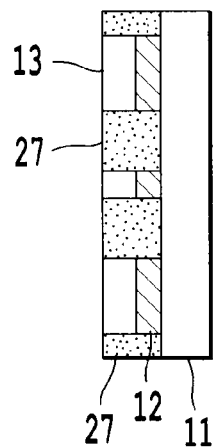

As shown in FIGS. 7A, 7B and 7C, the STI 27 is then etched back by use of the RIE method so as to have the same thickness as the semiconductor film 13. Subsequently, the silicon nitride film 51 is removed by a wet etching method.

Figure 8A:
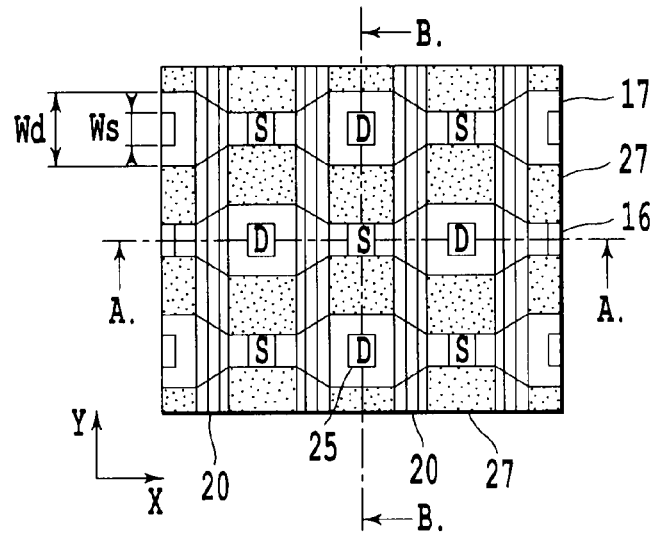
FIGS. 8A, 8B and 8C sequentially show processes of manufacturing the semiconductor memory device according to embodiment 1 of the present invention.
Figure 8B:
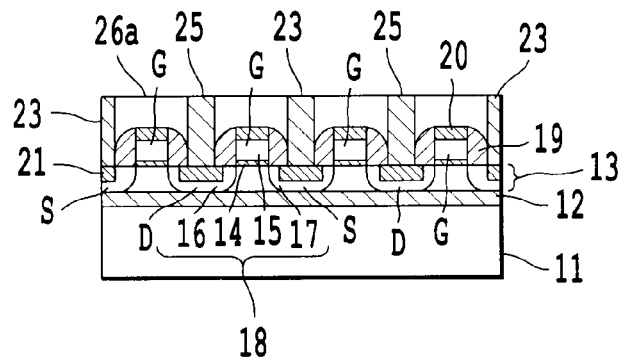
Figure 8C:
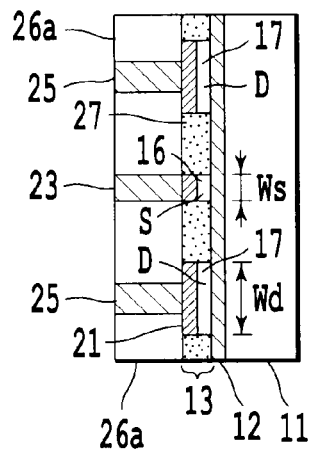

As shown in FIGS. 8A, 8B and 8C, the gate electrode 15 is formed on the semiconductor film 13 with the gate insulating film 14 therebetween by a known method. The drain region 16 and the source region 17 are formed so as to sandwich the gate electrode 15 in a gate length direction.

To be specific, the gate insulating film 14 is formed on the semiconductor film 13 by use of a thermal oxidation method. A polysilicon film is formed on the gate insulating film 14 by a CVD method. Then, the gate electrode film 15 is formed by use of a photolithography method.

Then, in order to reduce a contact resistance, the silicide film 20 is formed on the gate electrode 15, and the silicide film 21 is formed in the drain region 16 and the source region 17. The silicide films 20 and 21 are for example a tungsten silicide (WSi) film.

Next, the side wall film 19 is formed on the side wall of the gate electrode 15 by use of the CVD or the RIE method. The drain region 16 and the source region 17 are formed in a self-aligning manner on the side wall film 19 by use of an ion implantation method After that, an interlayer insulating film 26a is formed on the cell transistor 18. A contact hole (not shown) is formed in a position corresponding to the silicide film 21 of the source region 17. A conductive material is embedded in the contact hole to form the contact plug 23.

Likewise, a contact hole (not shown) is formed in a position corresponding to the silicide film 21 of the drain region 16. A conductive material is embedded in the contact hole to form the contact plug 25.

Figure 9A:
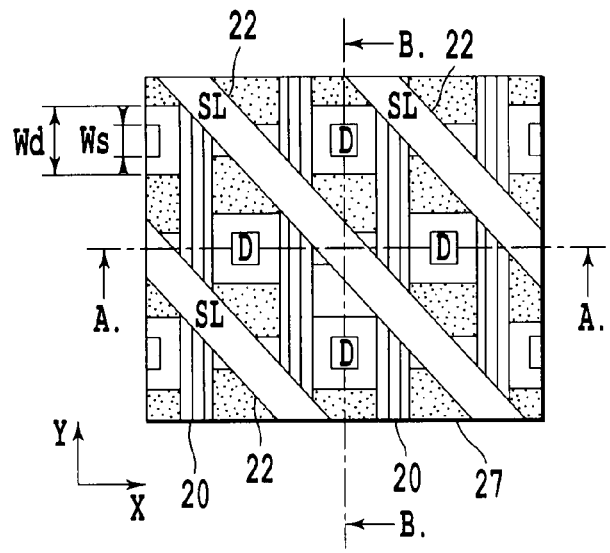
FIGS. 9A, 9B and 9C sequentially show processes of manufacturing the semiconductor memory device according to embodiment 1 of the present invention.
Figure 9B:
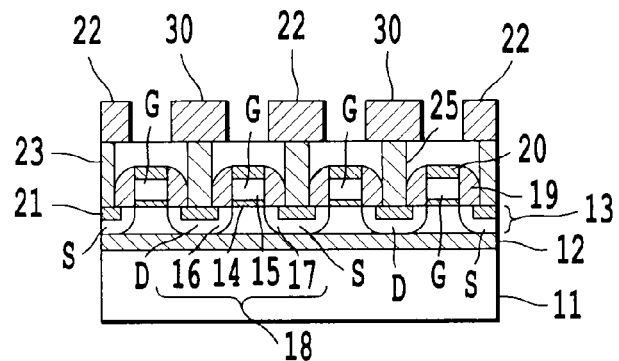
Figure 9C:
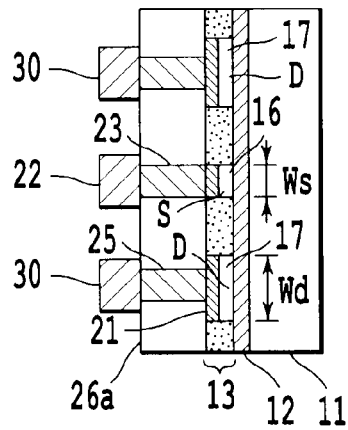

Then, as shown in FIGS. 9A, 9B and 9C, the source regions 17, of the cell transistors 18, obliquely adjacent to each other with respect to the first direction X are commonly connected to the angled source line 22 arranged in stripes via the contact plugs 23. A connection electrode 30 having a cross-sectional area larger than that of the contact plug 25 is also formed on the contact plug 25 exposed from the interlayer insulating film 26a in parallel to the formation of the source line 22.

Next, an interlayer insulating film (not shown) is formed on the cell transistor 18 including the source line 22 while a contact hole (not shown) is formed in a position corresponding to the connection electrode 30 of the interlayer insulating film. A conductive material is embedded in the contact hole to form the contact plug 31. The drain regions 16 of cell transistors 18 adjacent to each other in the first direction X are connected to the bit line 24 (not shown) via the contact plugs 25 and 31 and the connection electrode 30.

The above process provides a semiconductor memory device 10 including a memory cell array in which: the cell transistors 18 shown in FIG. 1 are arranged in matrix, the cell transistors adjacent to each other are arranged so as to share the drain region 16 and the source region 17 in the first direction X of the matrix, the adjacent cell transistors 18 sandwiching the STI 27 are arranged in such a way that the drain region 16 of one cell transistor 18 and the source region 17 of another cell transistor 18 are opposite to each other in a second direction Y perpendicular to the first direction X of the matrix.

As described above, the semiconductor memory device 10 according to the present embodiment includes the cell transistor 18, formed on the semiconductor film 13 formed on the support substrate 11 with the insulating film 12 therebetween, having a larger border length Wd between the drain region 16 and the gate electrode film contiguous to each other than a border length Ws between the source region 17 and the gate electrode film 15 contiguous to each other.

Furthermore, the cell transistors 18 are arranged in matrix in such a way that the drain region 16 and the source region 17 of the adjacent cell transistors 18 sandwiching the STI 27 in the second direction Y are opposite to each other. The source regions 17, of the cell transistors 18, obliquely adjacent to each other with respect to the first direction X is commonly connected to the angled source line 22 arranged in stripes.

As a result, an impactization coefficient is increased and the amount of signals is increased. A signal margin is therefore improved. Consequently, a writing speed can be improved.

Furthermore, the resistance of the source region 17 is increased. Accordingly, the holes 40 coming from the channel region 41 into the source region 17 cannot enter the channel region 41 of the adjacent cell transistor 18b. Consequently, "1" disturb can be suppressed.

Even if the border length Wd between the drain region 16 and the gate electrode film 15 contiguous to each other and the border length Ws between the source region 17 and the gate electrode film 15 contiguous to each other are different from each other, an integration degree can be increased. Therefore, there is an advantage that the chip size of a semiconductor memory device 10 can be reduced.

Modification can be made only by changing patterns of the drain region 16, source region 17 and the source line 22. Hence, a small number of processes are necessary to manufacture the semiconductor memory device 10 having a single transistor DRAM.

Therefore, the semiconductor memory device 10 having a high performance single transistor DRAM can be obtained.

Here, the case where the source line 22 is of angled stripe-type is described, while a zigzag source line may be used.

Figure 10A:
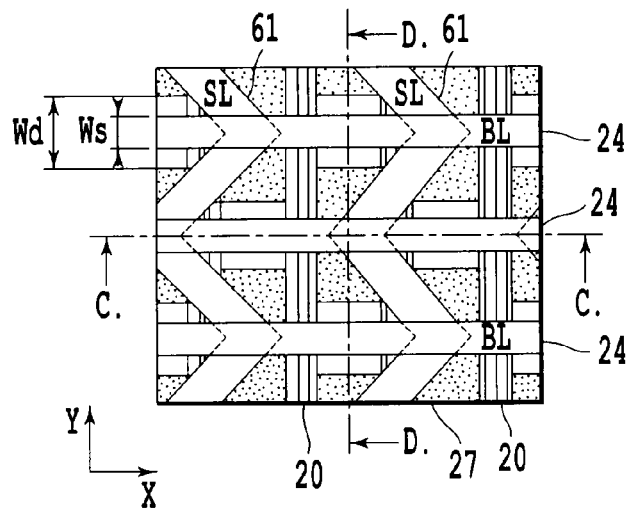
FIGS. 10A, 10B and 10C show another semiconductor memory device according to embodiment 1 of the present invention
Figure 10B:
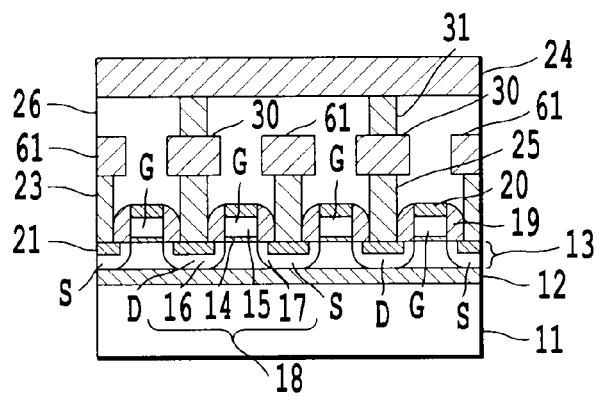
Figure 10C:
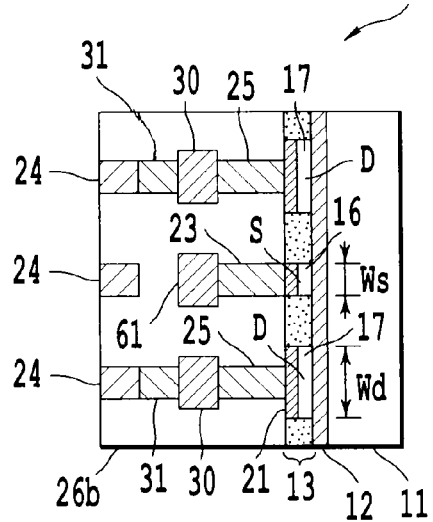

FIG. 10 shows another semiconductor memory device according to the present embodiment. FIG. 10A is a plan view of the semiconductor memory device. FIG. 10B is a cross-sectional view taken along line C-C of FIG. 10A when viewed in an arrow direction. FIG. 10C is a cross-sectional view taken along line D-D of FIG. 10A.

That is to say, as shown in FIGS. 10A, 10B and 10C, in a semiconductor memory device 60, the source regions 17 of the adjacent cell transistors 18 sandwiching the STI 27 in the second direction Y are commonly connected via the contact plugs 23 to a source line 61 extending zigzag along the second direction Y.

In the present embodiment, the case where the support substrate 11, the insulating film 12 and the semiconductor film 13 form an SIMOX wafer is described, while a bonded substrate produced by bonding two silicon substrates with an oxide film in between and grinding one of the two substrates into a thin film may be used.

The case where the cell transistor 18 is of N-channel type is described, while the same is true for the case where a cell transistor is of P-channel type. In this case, the conductivity types of a semiconductor film, a drain region and source region are inverted, and electrons are accumulated in a channel region.

A case where the support substrate 11 is a p-type silicon substrate 11 is described, while a silicon germanium (SiGe) substrate, a germanium (Ge) substrate and other compound semiconductor substrate may be used.

The case where the gate insulating film 14 is a silicon oxide film is also described, while a film having a dielectric constant larger than that of the silicon oxide film, such as a silicon oxynitride film (SiON), a hafnium oxide film ($HfO_2$), a hafnium silicon oxide film (HfSiO), a hafnium silicon oxynitride film (HfSiON), a hafnium aluminium oxide film (HfAlO), or a hafnium aluminium oxynitride film (HfAlON), may be used.

For example, a hafnium silicon oxynitride film (HfSiON) can be formed by forming a hafnium silicon oxide film ($HfSiO_4$) on the p-type silicon substrate 11 by use of a MOCVD method and then heat-treating the film in an ammonia (NH3) atmosphere or a nitrogen plasma atmosphere.

Embodiment 2

Figure 11A:
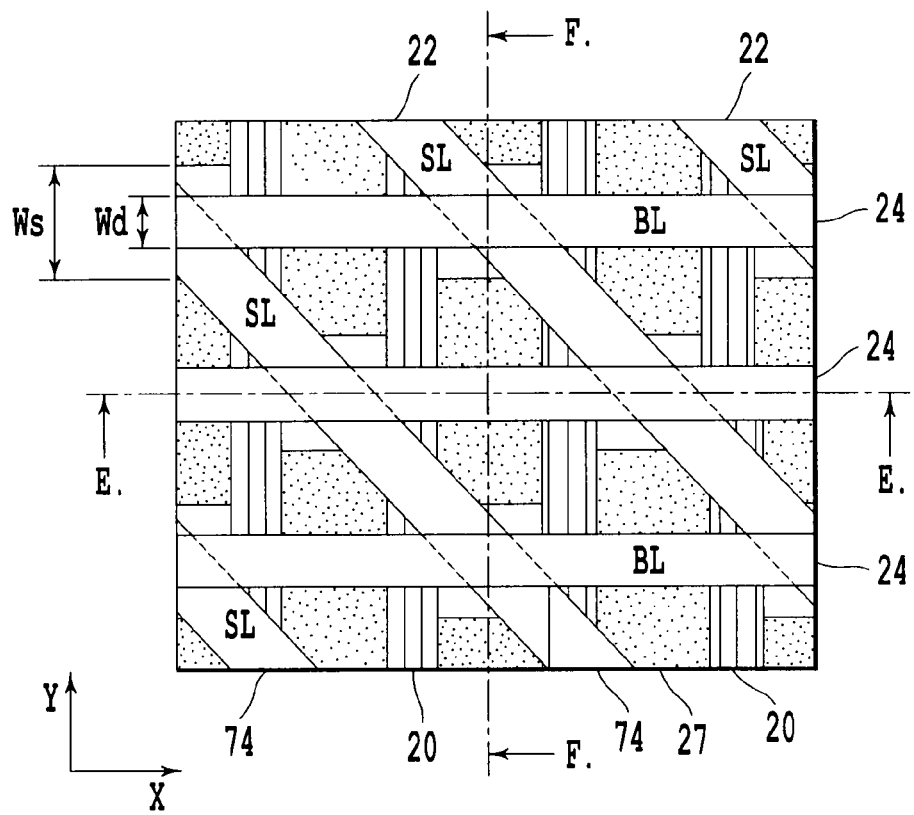
FIGS. 11A, 11B and 11C show the semiconductor memory device according to embodiment 2 of the present invention
Figure 11B:
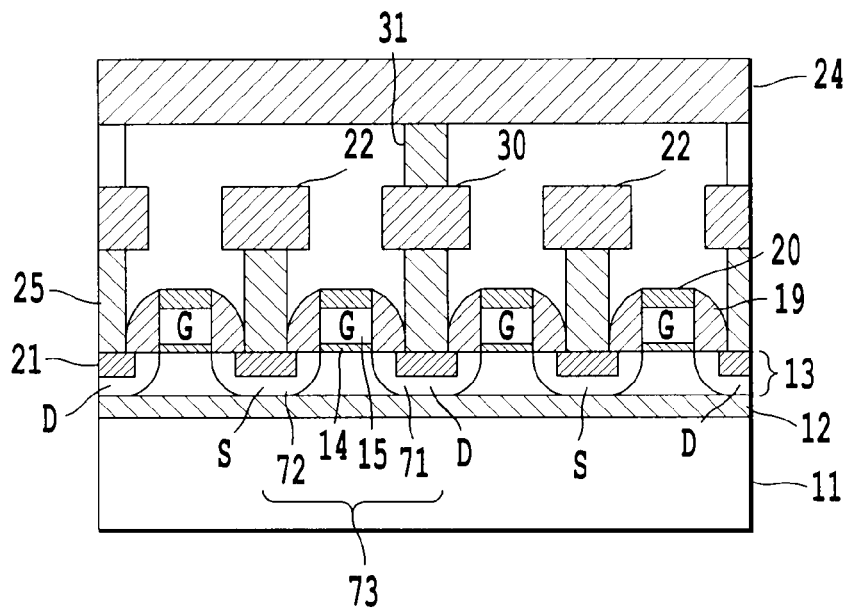
Figure 11C:
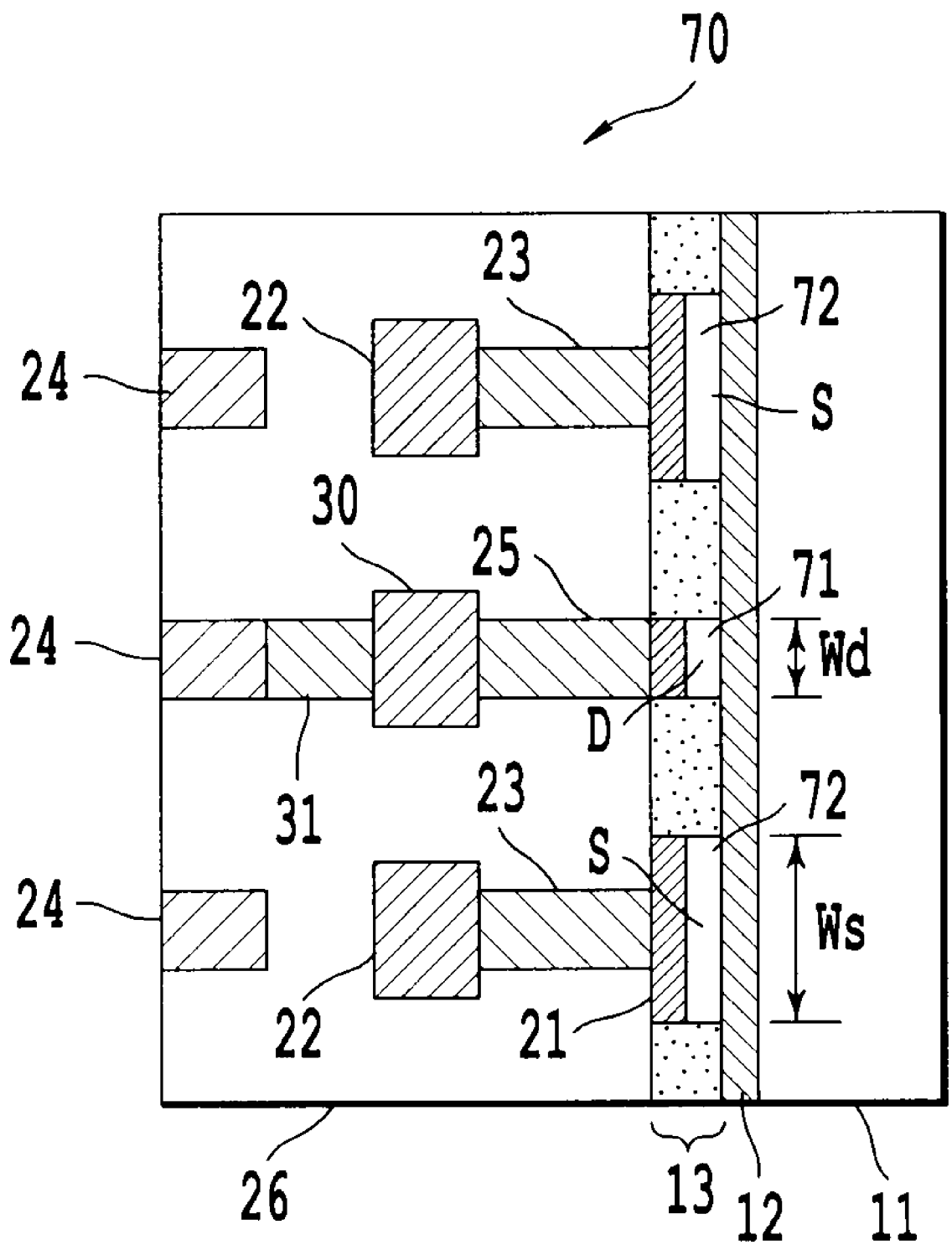
Figure 12A:
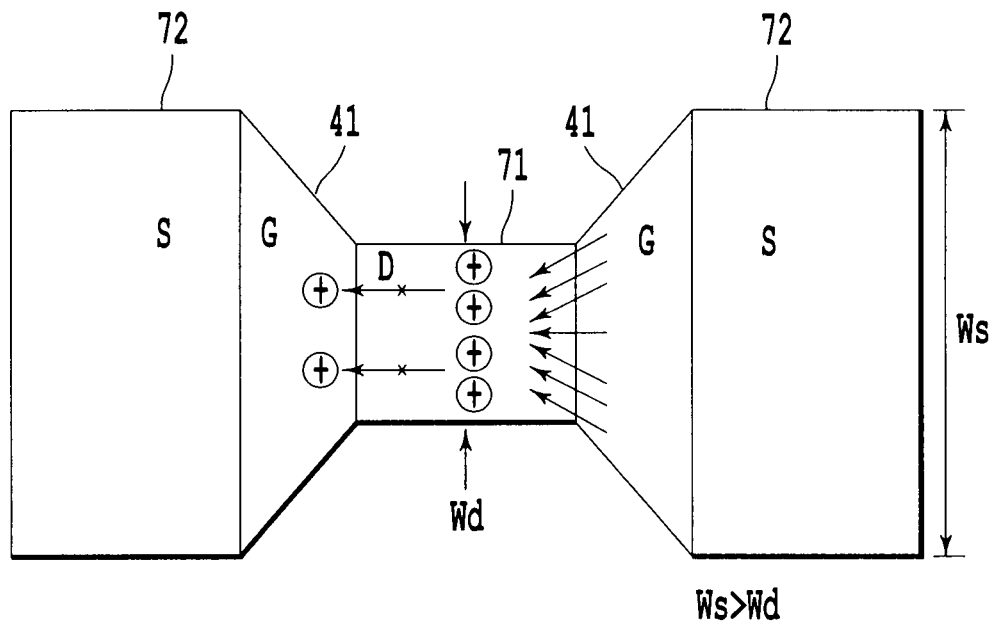
FIGS. 12A and 12B show an operation of the semiconductor memory device according to embodiment 2 of the present invention and FIG. 12A is a plan view of the semiconductor memory device and FIG. 12B is a cross-sectional view of the semiconductor memory device.
Figure 12B:
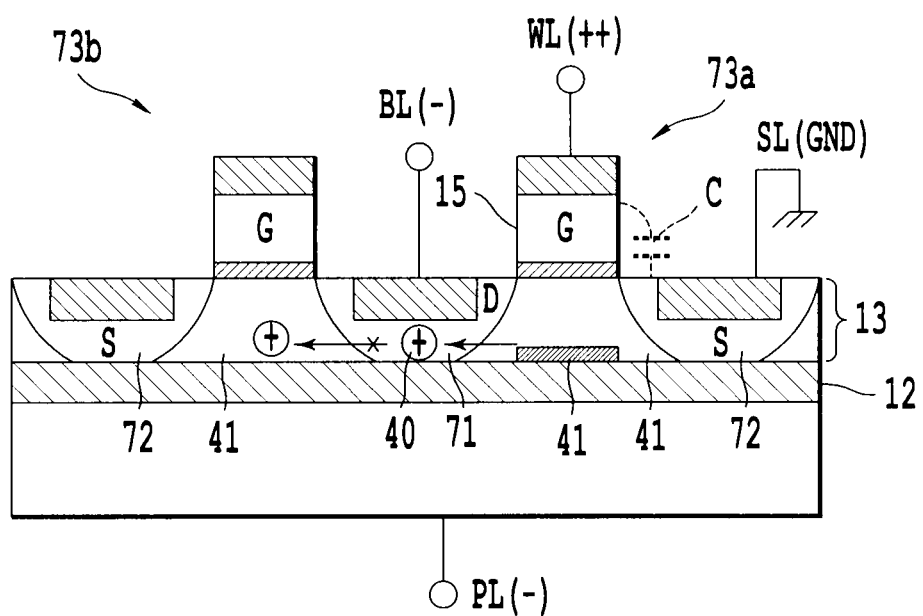

A semiconductor memory device according to an embodiment 2 of the present invention will be described with reference to FIGS. 11 and 12. FIG. 11 shows a semiconductor memory device. FIG. 11A is a plan view of the semiconductor memory device. FIG. 11B is a cross-sectional view taken along line E-E of FIG. 11A when viewed in an arrow direction. FIG. 11C is a cross-sectional view taken along line F-F of FIG. 11A when viewed in an arrow direction. FIG. 12 shows the operation of a semiconductor memory device. FIG. 12A is a plan view of the semiconductor memory device. FIG. 12B is a cross-sectional view thereof.

In the present embodiment, the same components as in the above embodiment 1 are given the same symbols. The descriptions of the same components are omitted, while different components will be described.

The difference of the present embodiment from embodiment 1 lies in the fact that a border length between the drain region and the gate electrode film contiguous to each other is smaller than a border length between the source region and the gate electrode film contiguous to each other. That is, in embodiment 1, it is an object to provide a semiconductor memory device suitable to suppress "1" disturb by making larger the border length between the drain region and the gate electrode film contiguous to each other than the border length between the source region and the gate electrode film contiguous to each other. With semiconductor memory devices, suppressing the malfunction (referred to as "0" disturb) where a data "1" state is rewritten to a data "0" state is sometimes required rather than suppressing "1" disturb. As described above, an object of embodiment 2 to be described below is to provide a semiconductor memory device suitable for suppressing "0" disturb by making smaller a border length between the drain region and the gate electrode film contiguous to each other than a border length between the source region and the gate electrode film contiguous to each other.

That is, as shown in FIGS. 11A, 11B and 11C, a semiconductor memory device 70 according to the present embodiment includes a cell transistor 73. The cell transistor 73 has a gate electrode film 15 formed on a semiconductor film 13 with a gate insulating film 14 therebetween, the semiconductor film 13 formed on the main surface of a support substrate 11 with an insulating film 12 therebetween, and a drain region 71 and source region 72 formed so as to sandwich the gate electrode film 15 in a gate length direction. In the cell transistor 73, the border length Wd between the drain region 71 and the gate electrode film 15 contiguous to each other is smaller than the border length Ws between the source region 72 and the gate electrode film 15 contiguous to each other.

The cell transistors 73 are arranged in matrix. The cell transistors 73 adjacent to each other are arranged so as to share the drain region 71 and the source region 72 in the first direction X of the matrix. The adjacent cell transistors 73 sandwiching the STI 27 are arranged in the second direction Y perpendicular to the first direction X in such a way that the drain region 71 of one cell transistor 73 and the source region 72 of another cell transistor 73 are opposite to each other.

FIG. 12 shows operation where data "0" is written in the cell transistor 73a, having data "1" already written, of the semiconductor memory device 70.

As shown in FIGS. 12A and 12B, when writing data "0" in the cell transistor 73a, the source line 22 is connected to a reference potential (GND), the bit line 24 is connected to a negative potential and a positive voltage is applied to a word line.

At this time, holes accumulated in the holes accumulation region 42 near the interface of the insulating film 12 rush from the channel region 41 into the drain region 71. Accordingly, the holes accumulation region 42 disappears.

This changes the threshold of the cell transistor 73a, thus causing the cell transistor 73a to be in a state where data "0" is written therein.

Then, the border length Wd between the drain region 71 and the gate electrode film 15 contiguous to each other is set small. Accordingly, the side wall capacity C of the drain region 71 is reduced. Consequently, a writing speed can be improved.

Furthermore, the resistance of the drain region 71 is increased, and hence, holes 40 rushing from the channel region 41 into the drain region 71 can be restrained from penetrating the drain region 71 and entering the channel region 41 of the cell transistor 73b.

Consequently, when the adjacent cell transistors 73b are in a data "0" state, "0" disturb can be suppressed.

The border length Wd between the drain region 71 and the gate electrode 15 contiguous to each other and the border length Ws between the source region 72 and the gate electrode film 15 contiguous to each other only need to be within a range of length providing a desired characteristics and are not particularly limited.

For example, the ratio of the length Wd to the length Ws is appropriately about 1.5 to 2 times in consideration of the integration degree and the obtained effect.

As described above, the semiconductor memory device 70 according to the present embodiment includes the cell transistor 73 in which the border length Wd between the drain region 71 and the gate electrode film 15 contiguous to each other is smaller than the border length Ws between the source region 72 and the gate electrode film 15 contiguous to each other.

As a result, the side wall capacity of the drain region 71 is reduced. Accordingly, a writing speed can be improved. Furthermore, the resistance of the drain region 71 is increased. Consequently, "0" disturb can be suppressed.

Therefore, the semiconductor memory device 10 having a high performance single transistor DRAM can be obtained.

Here, the case where the source line is the angled source line 22 arranged in stripes is described, while a zigzag source line 61 may be used.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor memory device comprising a cell transistor,
the cell transistor including:
a gate electrode film formed on a semiconductor film with a gate insulating film therebetween, the semiconductor film formed on a main surface of a support substrate with an insulating film therebetween; and
a drain region and a source region formed so as to sandwich the gate electrode film in a gate length direction, and
the cell transistor having a larger border length between the drain region and the gate electrode film contiguous to each other than a border length between the source region and the gate electrode film contiguous to each other.

2. The semiconductor memory device according to claim 1 further comprising a memory cell array including the cell transistors arranged in matrix, wherein
in a first direction of the matrix, each adjacent two of the cell transistors are arranged so as to share one of the drain region and the source region, and
in a second direction perpendicular to the first direction, cell transistors being adjacent to each other and sandwiching an element separation region are arranged in such a way that the drain region of one cell transistor and the source region of another cell transistor face each other.

3. The semiconductor memory device according to claim 2, wherein the source regions, of the cell transistors, obliquely adjacent to each other with respect to the first direction are commonly connected through vias to a source line arranged in stripes.

4. The semiconductor memory device according to claim 2, wherein the source regions of the adjacent cell transistors sandwiching the element separation region in the second direction are commonly connected to a zigzag source line via contact plugs.

5. A semiconductor memory device comprising a memory cell array including cell transistors arranged in matrix,
each of the cell transistors including:
a gate electrode film formed on a semiconductor film with a gate insulating film therebetween, the semiconductor film formed on a main surface of a support substrate with an insulating film therebetween; and
a drain region and a source region formed so as to sandwich the gate electrode film in a gate length direction, and
each of the cell transistors having a smaller border length between the drain region and the gate electrode film contiguous to each other than a border length between the source region and the gate electrode film contiguous to each other, wherein
in a first direction of the matrix, each adjacent two of the cell transistors are arranged so as to share one of the drain region and the source region, and in a second direction perpendicular to the first direction, cell transistors being adjacent to each other and sandwiching an element separation region are arranged in such a way that the drain region of one cell transistor and the source region of another cell transistor face each other.

6. The semiconductor memory device according to claim 5, wherein the source regions, of the cell transistors, obliquely adjacent to each other with respect to the first direction are commonly connected via contact plugs to a source line arranged in stripes.

7. The semiconductor memory device according to claim 5, wherein the source regions of the adjacent cell transistors sandwiching the element separation region in the second direction are commonly connected to a zigzag source line through vias.

8. A semiconductor memory device comprising:
a support substrate;
an insulating film formed on the support substrate;
a semiconductor film formed on the insulating film;
a gate insulating film formed on the semiconductor film;
a gate electrode film formed on the gate insulating film; and
a source region and a drain region formed in the semiconductor film so as to sandwich the gate insulating film in a gate length direction, the source and drain regions contacting the insulating film at the bottom surface, and the semiconductor memory device storing data corresponding to the amount of charges accumulated in the semiconductor film surrounded by the insulating film, the gate insulating film, and the source and drain regions and electrically floated, wherein
a border length between the source region and the gate insulating film contiguous to each other is different from a border length between the drain region and the gate insulating film to each other.

9. The semiconductor memory device according to claim 8 further comprising:
a first interlayer insulating film formed on the gate electrode film, the source region and the drain region;
a first contact plug formed in a contact hole penetrating the first interlayer insulating film and reaching the source region;
a second contact plug formed in a contact hole penetrating the first interlayer insulating film and reaching the drain region;
a source line formed on the first interlayer insulating film and connected to the source region via the first contact plug;
a second interlayer insulating film formed on the source line and the first interlayer insulating film;
a third contact plug formed in a contact hole penetrating the second interlayer insulating film and reaching the second contact plug; and
a bit line formed on the second interlayer insulating film and connected to the source region via the second contact plug and the third contact plug.

10. The semiconductor memory device according to claim 9, wherein the source line and the bit line extend in different directions.

11. The semiconductor memory device according to claim 10, wherein the bit line extends in the gate length direction.

12. The semiconductor memory device according to claim 10, wherein the source line extends in an oblique direction with respect to the gate length direction.

13. The semiconductor memory device according to claim 10, wherein the source line is of a zigzag shape.

14. The semiconductor memory device according to claim 8 further comprising a silicide film formed on the surfaces of the gate electrode film, the source region and the drain region.

15. The semiconductor memory device according to claim 9 further comprising a connection electrode on the second contact plug, the connection electrode having a larger cross-section area than the second contact plug.

16. The semiconductor memory device according to claim 8, wherein either of a border length between the source region and the gate insulating film contiguous to each other and a border length between the drain region and the gate insulating film contiguous to each other is 1.5 to 2 times the other.

* * * * *